United States Patent [19]
Komoriya et al.

[11] Patent Number: 4,699,505
[45] Date of Patent: Oct. 13, 1987

[54] EXPOSURE METHOD AND EXPOSURE APPARATUS

[75] Inventors: Susumu Komoriya, Tokorozawa; Hiroshi Nishizuka, Higashikurume; Shinya Nakagawa, Kodaira; Hisashi Maejima, Higashiyamato, all of Japan

[73] Assignee: Hitachi, Ltd., Tokyo, Japan

[21] Appl. No.: 742,786

[22] Filed: Jun. 10, 1985

[30] Foreign Application Priority Data

Jun. 11, 1984 [JP] Japan ............................. 59-118315

[51] Int. Cl.$^4$ ........................................ G03B 27/42
[52] U.S. Cl. .................................. 355/30; 355/53; 355/77
[58] Field of Search ................... 355/30, 53, 43, 77

[56] References Cited

U.S. PATENT DOCUMENTS

| | | | |
|---|---|---|---|
| 3,539,256 | 11/1970 | Ables | 355/53 |
| 3,569,718 | 3/1971 | Borner | 355/53 |
| 3,744,902 | 7/1973 | Henker | 355/53 |
| 4,084,903 | 4/1978 | Pircher | 355/53 |

FOREIGN PATENT DOCUMENTS 151936 9/1982 Japan ............................. 355/30

*Primary Examiner*—Monroe H. Hayes
*Attorney, Agent, or Firm*—Antonelli, Terry & Wands

[57] ABSTRACT

The invention deals with an exposure apparatus which detects environmental conditions such as atmospheric pressure, temperature and humidity in which the exposure apparatus is placed, and which maintains the projected magnification constant at all times based upon the detected values, so that the pattern can be reproduced precisely. Concretely, the apparatus comprises a detector to detect at least one of the tube temperature of the optical projecting system, humidity or atmospheric pressure near the optical system, and a control unit which controls optical characteristics based upon the signals detected by the detector. Namely, the control unit adjusts the optical characteristics depending upon the environmental conditions thereby to adjust variation in the projecting magnification and/or variation in the focal position. Thus, variation in the optical characteristics is adjusted to transfer the pattern maintaining high precision.

33 Claims, 10 Drawing Figures

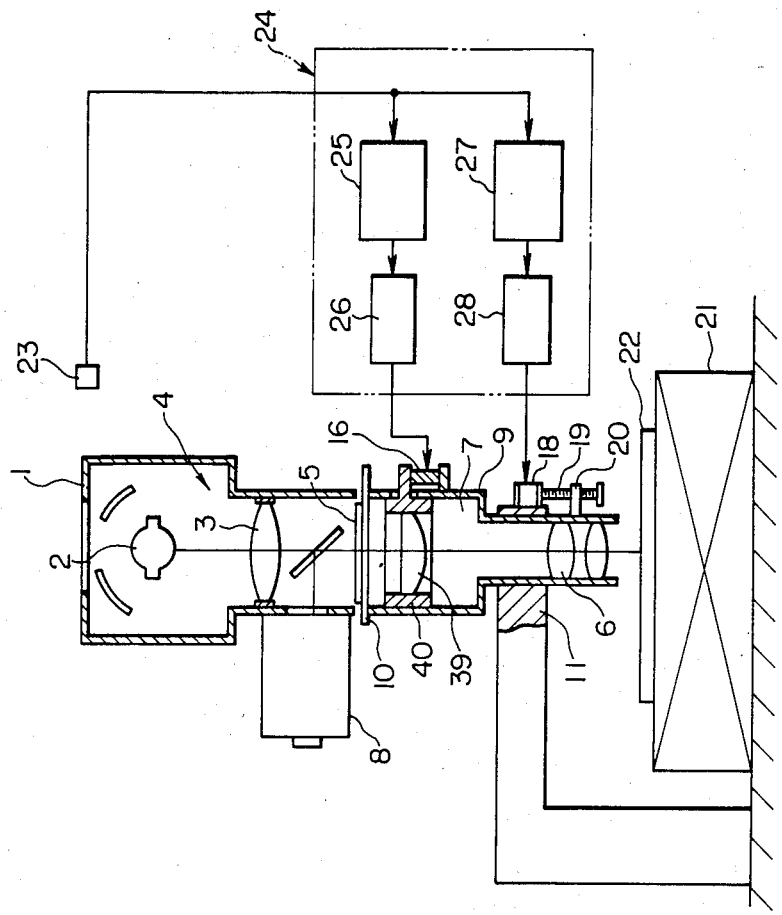
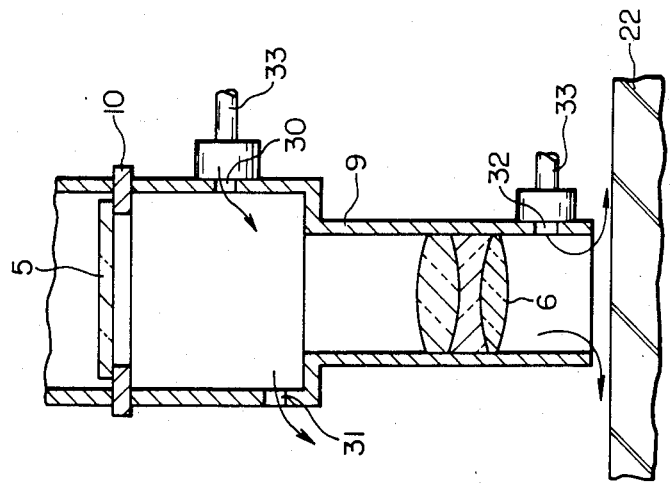
FIG. 9
FIG. 8

EXPOSURE METHOD AND EXPOSURE APPARATUS

BACKGROUND OF THE INVENTION

The present invention relates to an exposure method and an exposure apparatus which will reproduce patterns very precisely by adjusting such optical characteristics as magnification, focal distance and the like caused by the changing environmental conditions such as atmospheric pressure, temperature and humidity.

Photolithography is generally utilized in the manufacture of semiconductor devices such as IC's and LSI's, and patterns for reticles and photomasks are transferred onto the surfaces of an original photomask board and semiconductor wafer relying upon photographic techniques. A recent tendency has been to further reduce the size of pattern to be transferred accompanying the trend toward fabricating smaller element patterns for semiconductor devices in toward fabricating semiconductor devices more densely. Therefore, an exposure apparatus of the type of with a reduction proportion of 1:5, (or reduction ratio of 1/5) or deduction proportion of 1:10 (or reduction ratio of 1/10) has been much used in optical systems for transferring patterns.

A widely known exposure apparatus used for the manufacture of semiconductor devices has been disclosed in a journal Denshi Zairyo, Y. Kamata, S. Nakase, "Light Exposure Apparatus", November, 1983, separate volume, pp. 97–104, esp. pp. 97–98.

SUMMARY OF THE INVENTION

The inventors have attempted to transfer a variety of patterns using the exposure apparatus of this type, and have found that the reduction ratio of the pattern transferred, varied slightly depending from day to day and that the focal position also varied slightly. This variation occurred even when ambient temperature and humidity in a clean room in which the exposure apparatus was installed, were maintained constant, or even when an attempt was made to stabilize the wavelength of light from the light source.

The inventors therefore have conducted experiments extensively to find the cause of variation in the reduction ratio, and have arrived at the following conclusion. The inventors measured the daily change in the reduction ratio as well as the atmospheric pressure. A correlation was found as shown in FIG. 1 wherein the abscissa represents atmospheric pressure (January to February, 1984, Tokyo) and the ordinate represents the reduction ratio. Having plotted a number of data (only part of the data is plotted in FIG. 1(a), it was found that a correlation roughly given by a linear equation is established, i.e., atmospheric pressure P and the change of reduction ratio M satisfy a relation $M = K_p \times P + C_p$, where $K_p$ and $C_p$ denote constants determined by the characteristics of the optical system. Further, the reduction ratio M is defined in terms of the change in size relative to a pattern size of 13.5 mm as shown in FIG. 1(b). Namely, $M = \frac{1}{8}(\Delta A_X + \Delta A_Y + \Delta B_X + \Delta B_Y + \Delta C_X + \Delta C_Y + \Delta D_X + \Delta D_Y)$.

The inventors have furthered the study concerning the relation between the change in the reduction ratio and the atmospheric pressure to find a correlation between changes in the atmospheric pressure in the clean room (chamber) accompanying changes in ambient atmospheric pressure outside the chamber, changes in the reduction ratio, and changes in the focal position. It was found as shown in FIGS. 2 and 3 that the same correlation existed between the pressure in the clean room and the change in the reduction ratio just as under ambient atmospheric pressure outside the clean room, and that the same correlation existed with respect to the focal point though there existed some width in the change of the focal point.

The pressure in the clean room is maintained so as to be slightly higher (by about 1 mb) than the atmospheric pressure in order to prevent dust and dirt in the atmosphere outside from infiltrating the clean room.

The inventors have further repeated experiments extensively to discuss the cause of change in the reduction ratio (transfer magnification), and have found that the reduction ratio was directly affected by temperature, humidity, and atmospheric pressure of the environment in which the apparatus was installed.

That is, the tube in the optical projection system expands or contracts as temperature changes, and sizes of optical axes of reticle and lens change, thereby changing the reduction ratio. Moreover, moisture density of the air changes with humidity in the optical projection system, so that the relative refractive index of the lens changes so that the reduction ratio changes accompanying the focal distance.

Based upon the results discussed by the inventors, the object of the present invention is to provide an exposure method and an apparatus therefor, in which change in the projecting magnification such as reduction ratio of the transferred pattern and the change in the focal position, are adjusted independently of the change in the environmental conditions such as ambient atmospheric pressure, temperature, humidity and the like, to improve dimensional precision of the transferred pattern and to improve alignment precision, so that the pattern can be reproduced very precisely.

The above and other objects as well as novel features of the present invention will become obvious from the description of the specification and the accompanying drawings.

A representative example of the invention disclosed in this application will be briefly described below.

That is, the atmospheric pressure of the environment in which the exposure apparatus is placed is detected, the atmospheric pressure being subject to change depending upon the change in the external ambient atmospheric pressure, and the optical characteristics of the optical projecting system are controlled to remain substantially constant responsive to the change in the atmospheric pressure thereby to adjust variation in the projecting magnification and/or variation in the focal point, so that the pattern can be reproduced very precisely.

The optical characteristics can be controlled so as to remain constant by moving part of the optical projection system toward the direction of optical axis depending upon the change in atmospheric pressure, or by controlling the gaseous composition which is filled in the optical projection system.

More concretely, the method of controlling optical characteristics comprises a pressure gauge for detecting the atmospheric pressure of the environment in which the exposure apparatus is placed, a light path length setting portion for moving part of the optical projection system toward the direction of optical axis, and a control unit for controlling the light path length setting portion based upon a value detected by the pressure gauge. Further, the light path length setting portion constitutes a gas supply system to supply a required gas into the optical projection system, and the control unit controls the gas supply system to change the gaseous composition in the optical projection system.

According to the present invention, furthermore, environmental conditions such as temperature and humidity are detected in addition to the atmospheric pressure, and the projecting magnification is maintained constant at all times based upon the detected values, in order to transfer the pattern maintaining high precision.

More concretely, the invention comprises detectors to detect the temperature of the tube of the optical projection system, and to detect the humidity and pressure near the optical system, and a control unit which controls optical characteristics based upon the signals detected by the detectors. The control unit adjusts the optical characteristics depending upon the environmental conditions thereby adjusting variation in the projecting magnification and/or variation in the focal position, i.e., to adjust variation in the optical characteristics, so that the pattern can be reproduced very precisely.

BRIEF DESCRIPTION OF THE DRAWINGS

FIGS. 1(a) and 1(b) to FIG. 3 are graphs illustrating the correlation between the atmospheric pressure and the projecting magnification, and between atmospheric pressure and focal position;

FIG. 8 is a view showing a major portion on an enlarged scale; and

FIG. 9 is a view showing the whole construction of an embodiment 3.

DESCRIPTION OF THE PREFERRED EMBODIMENTS

[Embodiment 1]

Figure 4:
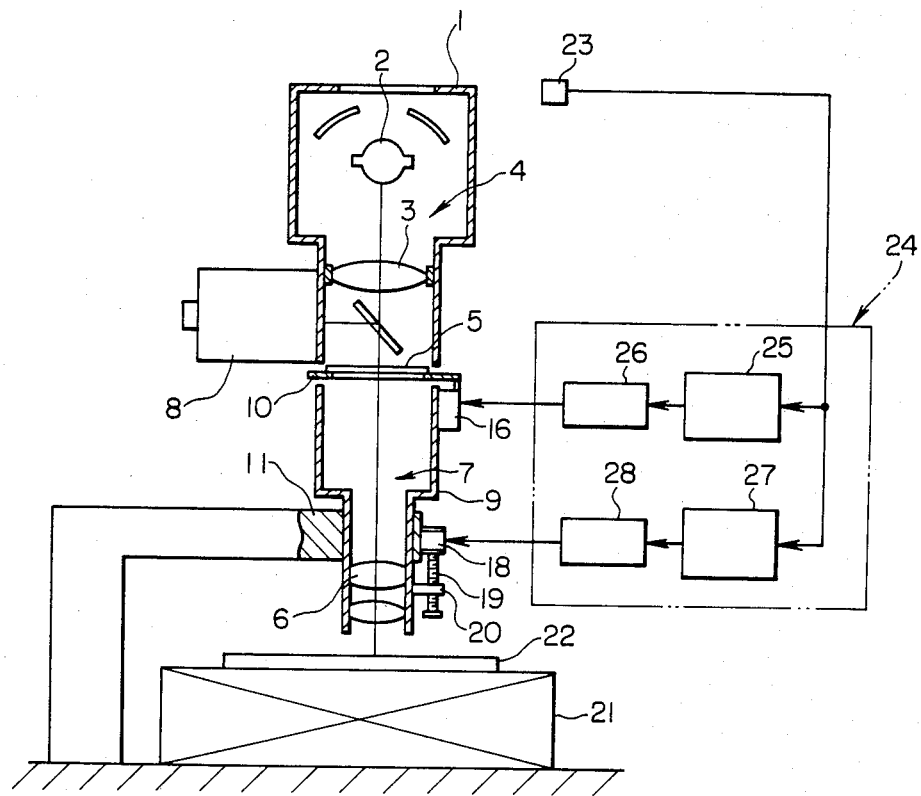
FIG. 4 is a view showing the whole construction of an embodiment 1 according to the present invention.
Figure 5:
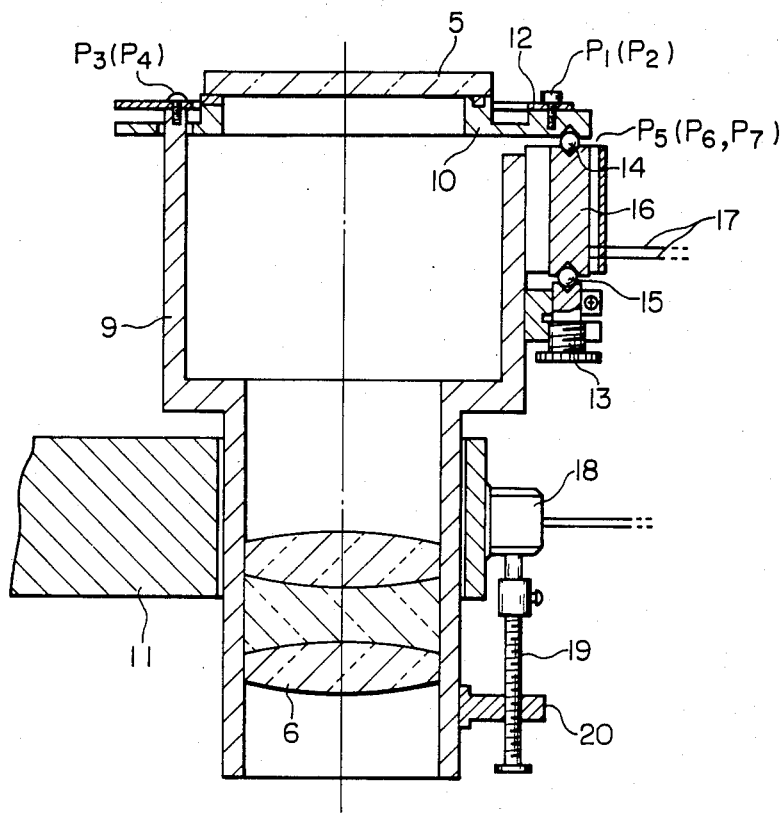
FIG. 5 is a view showing a major portion on an enlarged scale.
Figure 6:
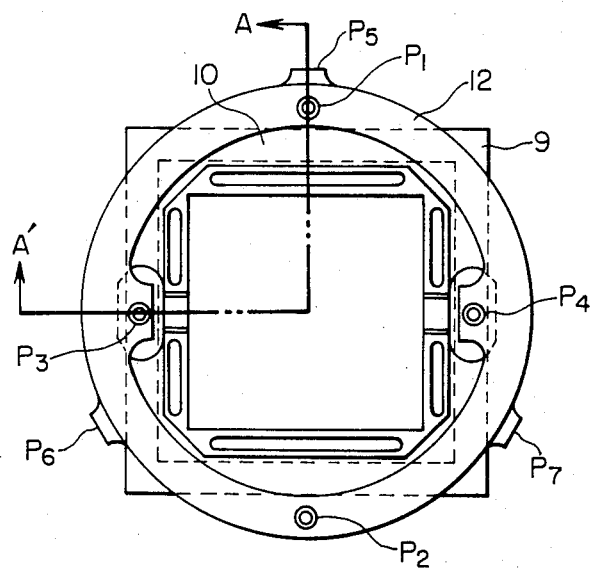
FIG. 6 is a plan view showing a major portion.

FIGS. 4 and 5 illustrate an exposure apparatus according to an embodiment of the present invention, wherein reference numeral 1 denotes an exposure body of an exposure apparatus which is equipped with an illuminating optical system 4 having a light source 2 and a condenser lens 3, and a optical projection system 7 having a pattern to be reproduced such as mask or reticle 5 illuminated by the illuminating optical system 4 and a lens group 6 for projecting and forming the pattern. Further, though details are not described, the exposure body 1 is equipped with an optical system 8 for setting the focus (focal point) of the projected image or for setting the alignment (position on a plane). As shown in FIG. 5 (which is a section view along the line A—A' of FIG. 6) on an enlarged scale, the projecting optical system 7 has a reticle support frame 10 mounted on the upper end of the tube 9 of which the lower portion is fitted to a frame 11. As shown in a plan view of FIG. 6, the reticle support frame 10 is attached to a resilient ring 12 at two points $P_1$, $P_2$, and is further attached at two points $P_3$, $P_4$ to the tube 9 via the resilient ring 12. Owing to the resilient ring 12 that undergoes resilient deformation, therefore, the reticle support frame 10 is allowed to move slightly in the direction of the optical axis relative to the tube 9. At three circumferential points $P_5$, $P_6$ and $P_7$, piezo-electric elements 16 are interposed in the direction of optical axis between the reticle support frame 10 and the adjusting screws 13 screwed into the tube 9 via balls 14, 15. The piezo-electric elements 16 are provided with electrodes to which lead wires 17 are connected. The electric current is supplied through the lead wires 17 so that the piezo-electric elements will undergo expansion or contraction in the direction of the optical axis depending upon the amount of current.

Further, the tube 9 equipped with the lens group 6 is allowed to move with respect to the frame 11 in the direction of the optical axis. For this purpose, a mechanism is employed consisting of a screw shaft 19 turned by a motor 18 mounted on the frame 11, and a nut 20 which is provided on the tube 9 and which engages the screw shaft 19. As the screw shaft 19 turns, the lens group 6 and the reticle support frame 10 move in the direction of the optical axis. Thus, the structure related to the reticle support frame 10 and the structure related to the lens group 6 constitute a light path length setting portion that sets the distance among the reticle 5, the lens group 6 and the wafer that will be described later, i.e., that sets the length of the light path.

An X-Y table 21 is disposed under the exposure body 1. A semiconductor wafer 22 is mounted on the X-Y table 21. The wafer 22 is placed on a position on which a pattern of the reticle 5 will be projected on a reduced scale.

A barometer 23 is installed in the environment or, generally, in a clean room in which the exposure body 1 and the X-Y table 21 are placed, and a control unit 24 is provided to control the light path length setting portion based upon the signals detected by the barometer 23. The control unit 24 comprises a projecting magnification correction operation circuit 25, a magnification driver 26, a focal position correction operation circuit 27, and a focal point driver 28, and controls the amount of electric current that flows into the piezo-electric elements 16 and to the motor 18 depending upon the atmospheric pressure of the environment as measured by the barometer 23.

Figure 1A:
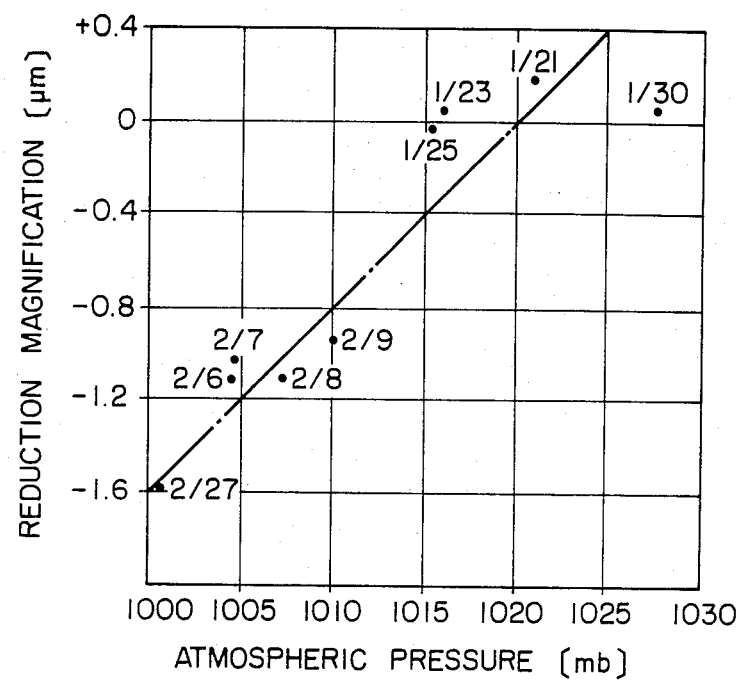
Figure 1B:
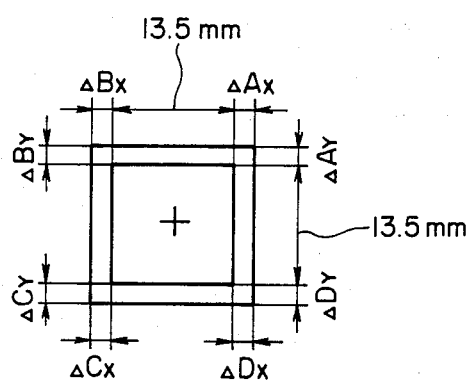
Figure 2:
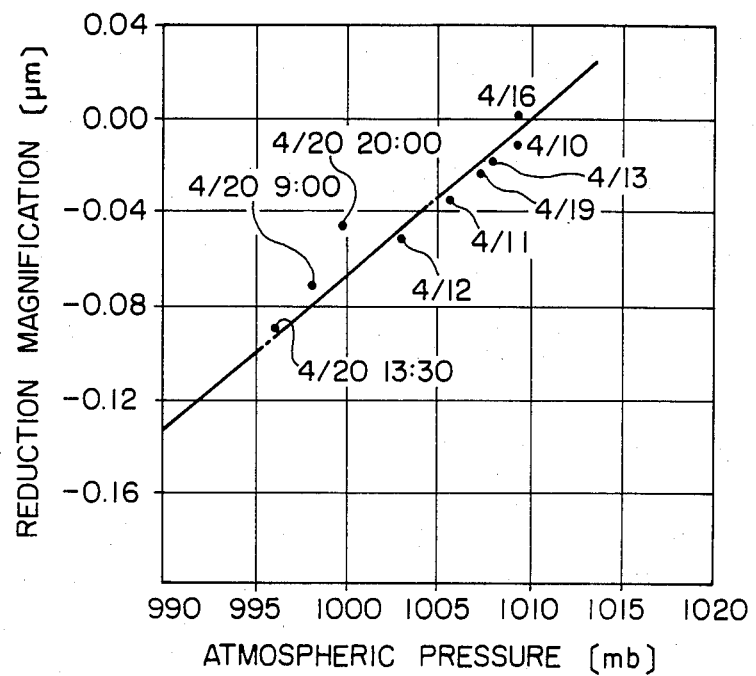
Figure 3:
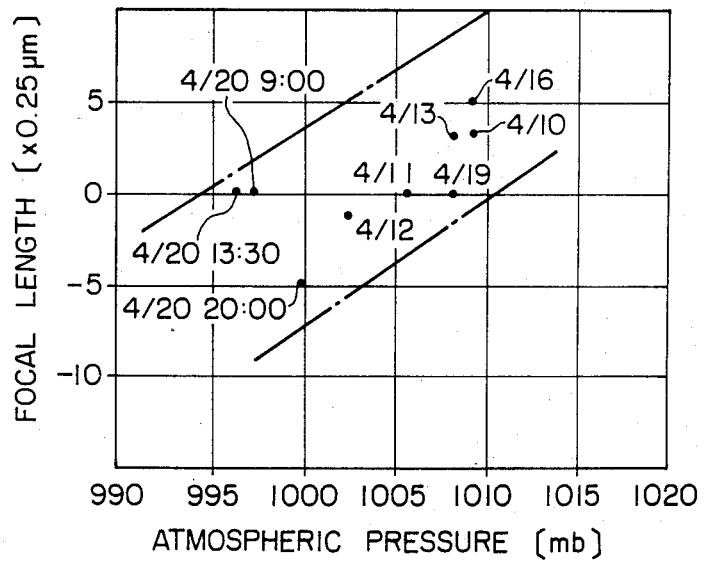

According to the above-mentioned construction, the focal point is set and the alignment is set by an automatic control mechanism in which the optical system 8 serves as a chief element. In addition to the above, however, the pressure in the environment is detected by the barometer 23. When the measured atmospheric pressure is lower than the expected atmospheric pressure, the density of the air is reduced, the focal distance of the lens group 6 decreases substantially, the projecting magnification of the projected pattern decreases substantially, and the value for focal position is less. Therefore, the projecting magnification correction operation circuit 25 calculates a corrected dimension based upon correlations shown in FIGS. 1 and 2 to reduce the distance between the lens group 6 and the reticle 5, so that the same magnification is obtained. The circuit 25 then operates the magnification driver 26 based upon the corrected dimension. Owing to the function of the magnification driver 26, a predetermined current flows into the piezo-electric elements 16 which then contract (or expand). As the piezo-electric elements 16 contract, the reticle support frame 10 moves downward relative to the tube 9, whereby the distance between the reticle 5 and the lens group 6 is maintained constant, i.e., the projecting magnification is maintained substantially constant irrespective of the change in the atmospheric pressure. Furthermore, the focal position correction operation circuit 27 calculates a correction quantity for the focal position relying upon the atmospheric pressure, and whereby the focal point driver 28 is operated to drive the motor 18. The lens group 6 then moves in the axial direction so that the focal position is maintained substantially constant. When the detected atmospheric pressure is higher than the expected atmospheric pressure, the reticle 5 and the lens group 6 move in the reverse direction, so that the magnification and the focal position are maintained substantially constant.

Thus, the magnification and focal position can be maintained substantially constant at all times between the reticle 5, lens group 6 and wafer 22 in the optical projection system irrespective of the change in the atmospheric pressure or in the atmospheric pressure of the environment such as the clean room in which the exposure apparatus is placed. Hence, the projecting magnification is prevented from varying and is stabilized, enabling the pattern to be reproduced very precisely. Since the magnification is stabilized, and the focal position is set to an optimum position, it is evident that the pattern is projected in a way that insures stable and precise reproduction.

[Embodiment 2]

Figure 7:
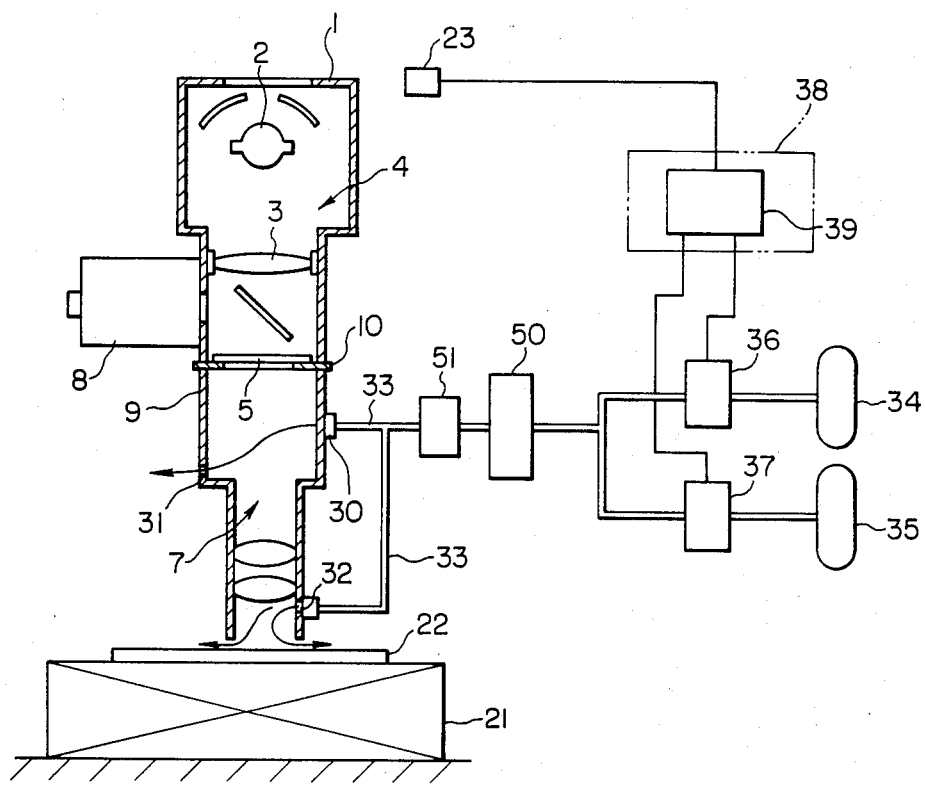
FIG. 7 is a view showing the whole construction of an embodiment 2.

FIGS. 7 and 8 illustrate another embodiment of the present invention, wherein the same portions as those of the above-mentioned embodiment are denoted by the same reference numerals. In this embodiment, the reticle support frame 10 of reticle 5 is secured to the tube 9 and the lower end of the tube 9 is stretched so as to come close to the surface of the wafer 22 on the X-Y table 21.

A gas intake port 30 and a gas exhaust port 31 are opened in the tube 9 between the reticle 5 and the lens group 6, and a gas intake port 32 is opened in the lens tube under the lens group 6. A gas supply pipe 33 is connected to these gas intake ports 30, 32. The gas is also supplied into the tube among the lenses 6. In this embodiment, furthermore, the gas supply pipe 33 is connected to a nitrogen source 34 and to an oxygen source 35. Values 36, 37 for controlling the gas flow rate are inserted in the pipe 33 to control the flow rates of gases supplied to the gas supply pipe 33. In order to adjust the temperature and humidity of gases, an adjusting unit 50 is inserted in the gas supply pipe 33. Further, a filter 51 is inserted in the gas supply pipe 33 to clean the gases. The gases which have passed through the adjusting unit 50 are adjusted to have a predetermined temperature and a predetermined humidity, and are introduced into the tube 9. Therefore, the temperature and humidity of gaseous atmosphere in the tube 9 can be adjusted to desired values. Further, since the gases that have passed through the filter 51 have been cleaned, foreign matter is suspended in very small amounts in the gaseous atmosphere in the tube 9. Therefore, optical characteristics are not adversely affected by foreign matter in the gaseous atmosphere that serves as a light path in the tube 9.

The gas supply system from the gas sources 34, 35 to the gas intake ports 30, 32 or the gas exhaust port 31, works to control the gaseous composition in the optical projection system 7; hence, substantially serves as a light path length setting portion to set the length of the light path.

A barometer 23 is installed near the exposure body 1 to detect the atmospheric pressure of the environment, and further, a control unit 38 is provided to control the valves 36, 37 in response to the detected atmospheric pressure, so that the flow rates of gases are controlled The control unit 38 contains circuit 39 which calculates the density of the air that varies with the change in the atmospheric pressure. In response to output of the circuit 39, the degree of opening of the valves 36, 37 is adjusted to control the flow rates of gases.

According to this construction, therefore, the nitrogen and oxygen from the gas sources 34, 35 are introduced into the tube 9 through gas supply pipe 33 and gas intake ports 30, 32, and are discharged through gas exhaust port 31 and the clearance between the wafer 22 and the tube 9. Therefore, the tube 9, i.e., the projecting optical system 7 is filled with a gaseous mixture consisting of nitrogen and oxygen, the pressure thereof being equal to, or slightly higher than, the outside ambient atmospheric pressure. The refractive index of light (D-ray having a wavelength of 589.3 nm) of a sodium lamp is 1 in a vacuum, 1.000292 in air, 1.000297 in the nitrogen, and 1.000272 in the oxygen. By mixing these gases at a suitable ratio, therefore, the refractive index of the gaseous atmosphere can be controlled.

Therefore, if the density of the air changes with the atmospheric pressure of the environment, densities (relative to the air) of the nitrogen and oxygen change, too, resulting in the changes in the densities of gases in the projecting optical system 7. Accordingly, the refractive index changes and the projection magnification changes. The barometer 23 however, detects the change in the atmospheric pressure, and degree of opening of the control valves 36, 37 is adjusted depending upon the calculated result from the circuit 39, and whereby the mixture ratio of nitrogen and oxygen is so changed that the composition thereof, that is, the initially selected refractive index is maintained. Hence, refractive indexes of lenses and gases in the optical projection system 7 can be maintained constant irrespective of changes in the atmospheric pressure of the environment, and the projection magnification can be maintained substantially constant.

By maintaining a refractive index constant relying upon the gaseous composition, it is possible to maintain constant projection magnification as well as focal position. Furthermore, the atmospheric pressure of environment and the focal position can be displayed in real time on a display panel.

In the foregoing description, the nitrogen and oxygen were used to adjust the refractive index.

In addition to nitrogen and oxygen, however, use can be made of carbon dioxide gas, water vapor, helium, neon, argon, and the like, to adjust the refractive index. Table 1 shows refractive indexes and densities of these gases.

TABLE 1

| | Refractive indexes and densities of gases. | |
|---|---|---|
| Gases | ← Refractive indexes using D-ray ($\lambda$ = 589.3 nm) under 1 atm. at 0° C. relative to vacuum | Densities (kg m$^{-3}$) under 1 atm. at 0° C. |
| Air | 1.000292 | 1.293 |
| Oxygen | 1.000272 | 1.429 |
| Nitrogen | 1.000297 | 1.250 |
| Carbon dioxide | 1.000450 | 1.977 |
| Water vapor | 1.000252 | 0.598 |

TABLE 1-continued

Refractive indexes and densities of gases.

| Gases | Refractive indexes using D-ray ($\lambda = 589.3$ nm) under 1 atm. at 0° C. relative to vacuum | Densities (kg m$^{-3}$) under 1 atm. at 0° C. |
|---|---|---|
| Helium | 1.000035 | 0.1785 |
| Neon | 1.000067 | 0.900 |
| Argon | 1.000284 | 1.784 |

Gases having large refractive indexes and small refractive indexes relative to air (refractive index, 1.000292) should be selected and used in combination to adjust the refractive index. By mixing such gases at predetermined ratios, therefore, the refractive index of the gaseous atmosphere can be controlled. In accordance with the preferred embodiment of the present invention, therefore, use can be made of carbon dioxide having a large refractive index, the air having a standard refractive index, and helium gas having a small refractive index. With a gaseous mixture consisting of carbon dioxide, air and helium, the refractive index of the gaseous atmosphere in the light path in the tube 9 can be easily adjusted to obtain a desired value by changing the mixture ratio of the gas having a large refractive index, the gas having a standard refractive index, and the gas having a small refractive index. More specifically it is possible to adjust the refractive index over a range of from a large value to a small value. There exists a difference of about 40 millibars between the maximum atmospheric pressure and the minimum atmospheric pressure over the whole year, i.e., a variation of about ±20 millibars relative to the average atmospheric pressure. Using the gaseous mixture consisting of carbon dioxide, air and helium however, the refractive index can be adjusted over a range of from a large value to a small value. Therefore, even when the atmospheric pressure changes greatly throughout the year, the refractive index can be properly adjusted by adjusting the mixture of the gases depending upon the change in the atmospheric pressure. Furthermore, carbon dioxide, air and helium are inexpensive, harmless, and can be easily handled. Moreover, the gaseous mixture consisting of carbon dioxide, air and helium does not take part in the chemical reaction even when it has received optical energy thermal energy from the exposure rays, and does not deteriorate or adversely affect the lenses or the tube in the optical system.

According to another embodiment of the invention, the gas is further supplied to a place near the lenses in the optical system and to space between the lenses. By supplying gases for controlling the refractive index to the place near the lenses and to the space between the lenses, the mixing ratio of gases can be adjusted in such places to cope with the change in the environmental conditions such as atmospheric pressure, temperature and humidity, in order to obtain predetermined optical characteristics such as refractive index, focal distance, and reduction ratio.

The gas supply pipe 33 according to the invention is connected to various gas sources via control valves to adjust the flow rates of gases. The gas supply system from the gas sources to the gas intake ports 30, 32 or to the gas exhaust port 31, controls the gaseous composition in the optical projection system 7; hence, substantially serves as a light path length setting portion to set the length of the light path.

A barometer 23 is installed near the exposure body 1, and a control unit 38 is provided to control the valves responsive to the detected atmospheric pressure, so that the flow rates of gases are controlled. The control unit 38 contains an operation circuit 39 which calculates the density of the air that varies with the change in the atmospheric pressure. Responsive to outputs of the operation circuit 39, opening degrees of the valves are adjusted to control the flow rates of gases.

According to this construction, therefore, the gases from the gas sources are introduced into the tube 9 through gas supply pipe 33 and gas intake ports 30, 32, and are discharged through gas exhaust port 31 and clearance between the wafer 22 and the tube 9. Therefore, the tube 9, i.e., the optical projection system 7 is filled with the gaseous mixture, the pressure thereof being equal to, or slightly higher than, the ambient external atmospheric pressure. By mixing the gases in a suitable ratio, the refractive index of the gaseous atmosphere can be controlled.

The inventors have repeated experiments extensively to determine the cause of change in the reduction ratio (transfer magnification), and have found that the reduction ratio was directly affected not only by atmospheric pressure but also by ambient temperature and humidity of the environment in which the apparatus was installed.

That is, the tube in the optical projection system expands or contracts as temperature changes, so that the size of optical axes of reticle and lens also change thereby changing the reduction ratio. Moreover, the moisture content of the air changes in the optical projection system as humidity change, and whereby the relative refractive index of the lens changes so that the reduction ratio changes with the focal distance.

Based upon the results determined by the inventors, there is provided according to the present invention an exposure method and an apparatus therefor, in which change in the projecting magnification such as reduction ratio of the transferred pattern is prevented from taking place irrespective of the change in the environmental conditions such as atmospheric pressure, temperature and humidity, to improve dimensional precision of the transferred pattern, so that the pattern can be reproduced very precisely.

The invention comprises, in addition to those mentioned in embodiment 1 or 2, detectors such as thermometer and hygrometer to detect the temperature of the tube of the optical projection system, and to detect the humidity near the optical system, the detectors being installed near the apparatus or directly on the apparatus, and a control unit which controls optical characteristics based upon signals detected by the detectors. Namely, the control unit adjusts the optical characteristics depending upon environmental conditions, so as to adjust variations in the projection magnification and/or variation in the focal position, i.e., to adjust variation in the optical characteristics, so that the pattern can be reproduced very precisely.

[Embodiment 3]

FIG. 9 shows a further embodiment of the present invention, wherein the same portions as those of the embodiment of FIG. 4 are denoted by the same reference numerals. In this embodiment, among the group of lenses 6, a moving lens 39 close to the reticle is held by a moving lens support 40. The piezo-electric elements 16 are interposed between the tube 9 and the moving lens support 40. The piezo-electric element 16 are provided with electrodes to which the lead wires are connected. By supplying electric current, the piezo-electric element can be expanded or contracted in the direction of optical axis depending upon the amount of electric current.

In a telecentric projecting optical system in which the beam is perpendicularly incident upon the pattern surface, in general, it is difficult to correct the magnification by moving the reticle up and down. In such a telecentric projecting optical system, a lens close to the reticle is moved in the direction of the optical axis to change the reduction ratio. The reduction ratio can be maintained constant irrespective of the change in the atmospheric pressure by detecting the atmospheric pressure using barometer 23, and moving the lens 39 depending upon the atmospheric pressure in the direction of optical axis.

The invention was concretely described in the foregoing with reference to embodiments. The invention is concerned with an exposing method and an exposing apparatus. Namely, the invention relates to an exposure method wherein at least one of the environmental conditions, i.e., at least one of atmospheric pressure, temperature and humidity in which the exposure apparatus is placed, is detected, and the refractive index of the optical projection system of the exposure apparatus and/or the focal position are controlled so as to obtain desired values depending upon the change in the environmental conditions.

According to the exposure method of the invention, composition of the gases in part or whole of the optical projection system is changed depending upon the change in the atmospheric pressure of the environment.

According to the exposure method of the present invention, furthermore, ambient atmospheric pressure is detected as the atmospheric pressure of the environment.

The invention further relates to an exposure apparatus comprising: a detecting portion which detects at least one of the environmental conditions, i.e., at least one of atmospheric pressure, temperature and humidity in which the exposure apparatus is placed; a light path length setting portion which changes the refractive index of gas in the projecting optical system in the exposure apparatus to change the relative refractive index of the optical system, in order to change the length of the optical path; and a control unit which controls the light path length setting portion based upon environmental condition signals such as atmospheric pressure, temperature and humidity detected by the detecting portion, and which sets the projecting magnification of the pattern to be projected and/or the focal position to predetermined values.

According to the exposure apparatus of the invention, the light path length setting portion is constituted as a gas supply system which forms a predetermined gaseous atmosphere in part of whole of the optical projection system.

According to the exposure apparatus of the invention, furthermore, mixing ratio of a plurality of gases is changed by the gas supply system, in order to change the refractive index of the gases.

In the exposure apparatus of the present invention, the pressure detecting portion is a barometer.

Effects of the invention are described below.

(1) Changes in the environmental condition such as atmospheric pressure, temperature and humidity in which the exposure apparatus is placed, are detected, and the control operation is reliably carried out depending upon the detected values, so that the refractive index of the projecting optical system will not be substantially changed. Therefore, the projecting magnification and/or the focal position are prevented from changing irrespective of the change in the environmental conditions, and the pattern is transferred maintaining high precision.

(2) The apparatus comprises a pressure detecting portion for detecting the atmospheric pressure of environment, a setting portion for substantially setting the length of the optical path in the optical projection system, and a control unit which controls the refractive index in the optical path length setting portion to a constant value relying upon the values detected by the pressure detecting portion. Therefore, the refractive index can be controlled substantially in real time responsive to changes in atmospheric pressure of the environment, and the projecting magnification can be stably controlled maintaining high precision.

(3) The light path length setting portion is set to be substantially constant by changing the distance among the lens, reticle and wafer depending upon the change in the atmospheric pressure of the environment. Therefore, magnification can be controlled at high speeds maintaining high precision. Furthermore, the angle for supporting the reticle can be easily adjusted, making it possible to adjust trapezoidal deformation.

(4) The light path length setting portion is so constructed as to maintain a constant refractive index for gas supplied into the optical projecting system irrespective of the change in the atmospheric pressure. Therefore, the magnification can be stably controlled, and the method can be easily adapted to an existing exposing apparatus at a reduced cost.

The invention accomplished by the inventors was concretely described in the foregoing by way of embodiments. The invention, however, should in no way be limited to the above embodiments only but can be modified in a variety of other ways without departing from the spirit and scope of the invention. For instance, the pressure detecting portion may detect the ambient atmospheric pressure, and the atmospheric pressure of environment may be found from the difference between the atmospheric pressure of environment (clean room) which as been determined in advance and in which the exposure apparatus is placed. Or, magnification may be controlled depending directly upon ambient atmospheric pressure.

It can also be arranged to maintain the length of the light path substantially constant by controlling the temperature or the humidity in the optical projecting system, so that the length of the light path of the tube is changed by the thermal expansion and the focal distance of the lens is changed in the optical system by the water vapor. Theoretically, it is also possible to maintain constant the environmental conditions in which the exposure apparatus is placed. This, however, is very expensive and is not practicable.

It is also allowable to utilize a mechanically working expanding/contracting mechanism instead of the piezo-electric elements used in the embodiment 1. In addition to the nitrogen and oxygen used in the embodiment 2, furthermore, it is permissible to use other gases as well as combinations with other gases such as $CO_2$, freon, and the like, as mentioned earlier. It is further possible to supply the gas to a portion of the optical projecting system 7 in the embodiment 2, to correct the projecting magnification. This may be combined with the correction of focal position of the embodiment 1. Furthermore, since the magnification may often be changed by the change in the environmental temperature and humidity, the temperature and humidity may be detected to control the optical characteristics relying thereupon.

The above description has dealt with the case where the invention accomplished by the inventors was adapted to the exposure technique of the type of reduced magnification for use in the photolithography technique for the semiconductor devices in the field of art that serves as the background of the present invention. The invention, however, is not limited thereto only but can also be adapted to the exposure technique of the type of the same magnification as well as to the exposure technique of the fields other than the manufacture of semiconductor devices.

What is claimed is:

1. An exposure method comprising the steps of detecting environmental conditions including at least atmospheric pressure in which an exposure apparatus is placed, and controlling the refractive index of gas in an optical projecting system of the exposure apparatus in dependence upon at least the detected atmospheric pressure to change the relative refractive index of the optical system so as to change the length of the optical path of the optical system for setting at least one of the projecting magnification of the pattern to be projected and the focal position to predetermined values.

2. An exposure method according to claim 1, wherein the step of controlling includes changing compositions of at least one gas in the optical projecting system.

3. An exposure method according to claim 1, wherein the step of detecting includes detecting the atmospheric pressure of the open air as the atmospheric pressure of the environment.

4. An exposure method according to claim 1, wherein the step of detecting the environmental conditions further includes detecting at least one of temperature and humidity.

5. An exposure apparatus comprising: means for detecting environmental conditions including at least atmospheric pressure in which the exposure apparatus is placed; a light path length setting means for changing the refractive index of gas in an optical projecting system in the exposure apparatus to change the relative refractive index of the optical system so as to change the length of the optical path of the optical system; and control means for controlling the light path length setting means based upon the signals produced by said detecting means and for setting at least one of the projecting magnification of the pattern to be projected and the focal position to predetermined values.

6. An exposure apparatus according to claim 5, wherein the light path length setting means is constituted as a gas supply system which forms a predetermined gaseous atmosphere in at least part of the optical projecting system, and the control means changes the gaseous composition in the optical projecting system.

7. An exposure apparatus according to claim 6, wherein the control means changes the mixing ratios of a plurality of gases supplied by the gas supply system in order to change the refractive indexes of gases.

8. An exposure apparatus according to claim 5, wherein the means for detecting the environmental conditions further detects at least one of temperature and humidity.

9. An exposure apparatus comprising: a barometer which detects the atmospheric pressure of environment in which the exposure apparatus is placed; a light path length setting portion which changes the refractive index of gas in the optical projecting system in the exposure apparatus to change a relative refractive index of the optical system, in order to change the length of the optical path; and a control unit which controls the light path length setting portion based upon the atmospheric pressure signals produced by said barometer, and which sets the projecting magnification of the pattern to be projected and/or the focal position to predetermined values; wherein the light path length setting portion is constituted as a gas supply system which forms a predetermined gaseous atmosphere in part or whole of the optical projecting system, the gaseous composition in the optical projecting system is changed by the control unit, and the mixing ratio of a plurality of gases supplied by the gas supply system are changed in order to change the refractive indexes of gases.

10. An exposure apparatus according to claim 9, wherein adjusting units are installed in the gas supply system to adjust at least one of the temperature and humidity of gases.

11. An exposure apparatus according to claim 10, wherein a filter is installed in the gas supply system to clean the gases.

12. An exposure apparatus according to claim 9, wherein the plurality of gases supplied by the gas supply system consist of essentially of nitrogen and oxygen.

13. An exposure apparatus according to claim 9, wherein the plurality of gases supplied by the gas supply system consist essentially of carbon dioxide, air and helium.

14. An exposure apparatus according to claim 9, wherein the plurality of gases supplied by the gas supply system consist essentially of the air, a gas having a refractive index greater than that of the air, and a gas having a refractive index less than that of the air.

15. An exposure apparatus comprising a drive mechanism which is provided on the body of the exposure apparatus to change the distance between a reticle and a lens close to the reticle in the direction of an optical axis of an optical projecting system; detector means for detecting environmental conditions including at least atmospheric pressure in which the exposure apparatus is placed; and a control unit which controls said drive mechanism based upon the output of said detector means to adjust the projecting magnification of the exposure apparatus to a predetermined value.

16. An exposure apparatus according to claim 15, wherein the drive mechanism has three or more piezoelectric elements that undergo displacement by small amounts responsive to change of voltage, said piezoelectric elements being provided at the lower portion of a support frame to move said support frame holding the reticle up and down, and said piezo-electric elements are supplied with the same voltage or different voltages to control movement in the up and down direction.

17. An exposure apparatus for exposing a photoresist film coating on a wafer to a fine pattern on a reticle or mask by optically projecting the pattern onto the photoresist film comprising: a barometer which detects the atmospheric pressure of environment in which the exposure apparatus is placed; an effective light path length setting portion which changes the refractive index of gas in an optical projecting system in the exposure apparatus to change a relative refractive index of the optical system so as to change the effective length of the optical light path; and a control unit which controls the effective light path length setting portion based upon the atmospheric pressure signals produced by said barometer, and which sets the projecting magnification of the pattern to be projected; wherein the effective light path length setting portion is constituted as a gas supply system which forms a predetermined gaseous atmosphere in at least part of the optical projecting system, the gaseous state in the optical projecting system being changed by the control unit, and the state of at least one gas supplied by the gas supply system being changed in order to change the refractive index at least one of the gas.

18. An exposure apparatus according to claim 17, wherein adjusting units are provided in the gas supply system to adjust the temperature and humidity of the at least one gas.

19. An exposure apparatus according to claim 17, wherein a filter is provided in the gas supply system to clean the at least one gas.

20. An exposure apparatus according to claim 17, wherein gases are supplied by the gas supply system and consist essentially of nitrogen and oxygen.

21. An exposure apparatus according to claim 17, wherein gases are supplied by the gas supply system and consist essentially of carbon dioxide, air and helium.

22. An exposure apparatus according to claim 17, wherein gases are supplied by the gas supply system and consist essentially of air, a gas having a refractive index greater than that of the air, and a gas having a refractive index less than that of the air.

23. An exposure method for exposing a photoresist film coated on a wafer to a fine pattern on a reticle or mask by optically projecting the pattern onto the photoresist film comprising the steps of detecting the change of atmospheric pressure in which an exposure apparatus is placed, and controlling the refractive index of an optical projecting system of the exposure apparatus in accordance with the detected change to adjust the projecting magnification of the projected pattern to predetermined values.

24. An exposure method according to claim 23, wherein the step of controlling includes changing compositions of gases in at least part of the optical projecting system depending upon the change of atmospheric pressure.

25. An exposure method according to claim 23 wherein the step of detecting includes detecting the atmospheric pressure of the open air as the atmospheric pressure of the environment.

26. An exposure apparatus for exposing a photoresist film coated on a wafer to a fine pattern on a reticle or mask by optically projecting the pattern onto the photoresist film comprising: detecting means for detecting the atmospheric pressure in which the exposure apparatus is placed, an effective light path length setting means for changing the refractive index of gas in an optical projecting system in the exposure apparatus to change the relative refractive index of the optical system so as to change the effective length of the optical light path; and control means for controlling the effective light path length setting means in accordance with signals produced by said detecting means and for setting the projecting magnification of the pattern to be projected to predetermined values.

27. An exposure apparatus according to claim 26, wherein the effective light path length setting means is constituted as a gas supply system which forms a predetermined gaseous atmosphere in at least part of the optical projecting system, and the control means changes the gaseous composition in the optical projecting system.

28. An exposure apparatus according to claim 27, wherein the control means changes the mixing ratios of a plurality of gases supplied by the gas supply system in order to change the refractive indexes of gases.

29. An exposure apparatus for exposing a photoresist film coated on a wafer to a fine pattern on a reticle by optically projecting the pattern onto the photoresist film comprising: a drive mechanism which is provided on the body of the exposure apparatus to change the distance along an optical axis between a reticle and a lens close to the reticle in an optical projecting system; detector means for detecting atmospheric pressure in which the exposure apparatus is placed; and control means for controlling said drive mechanism based upon the output of said detector means to adjust the projecting magnification of the exposure apparatus to a predetermined value.

30. An exposure apparatus according to claim 29, wherein the drive mechanism has at least three piezo-electric elements that undergo displacement by small amounts responsive to change of voltage, said piezo-electric elements being provided at the lower portion of a support frame to move said support frame holding the reticle up and down, said piezo-electric elements being supplied with the same voltage or different voltages to control movement in the up and down direction.

31. An exposure method comprising the steps of detecting a change of environmental conditions including at least atmospheric pressure in which an exposure apparatus is placed, and controlling at least one of the refractive index of an optical projecting system of the exposure apparatus and the position of an optical axis of the exposure apparatus to adjust at least one of the projective magnification of the projected pattern and the focal position to desired values in accordance with the detected change, the step of controlling including changing compositions of gases in the optical projecting system depending upon the detected change of the environmental conditions.

32. An exposure apparatus according to claim 31, wherein the step of detecting includes detecting the atmospheric pressure of the open air as the atmospheric pressure of the environment.

33. An exposure method according to claim 31, wherein the step of detecting the environmental conditions further includes detecting at least one of temperature and humidity.

* * * * *